United States Patent [19]

Choisnet

[11] 4,283,715

[45] Aug. 11, 1981

[54] CONTROL OF DISPLAY DEVICES WITH ELECTROMAGNETIC DRUMS

[75] Inventor: Jöel Choisnet, Levallois-Perret, France

[73] Assignee: Jaeger, Levallois-Perret, France

[21] Appl. No.: 84,442

[22] Filed: Oct. 12, 1979

[30] Foreign Application Priority Data

Oct. 17, 1978 [FR] France .................... 78 29559

[51] Int. Cl.³ ............................................ G08B 5/30
[52] U.S. Cl. .............................. 340/378.1; 340/378.2
[58] Field of Search .................. 340/378.1, 378.2, 669, 340/707, 753; 364/112; 324/102

[56] References Cited

U.S. PATENT DOCUMENTS

| | | | |
|---|---|---|---|
| 3,007,637 | 11/1961 | Meirowitz | 340/378.2 |
| 3,794,972 | 2/1974 | Van Ostrum | 340/669 |
| 3,846,749 | 11/1974 | Curry | 340/669 |
| 4,161,782 | 7/1979 | McCracken | 364/112 |

*Primary Examiner*—Harold I. Pitts
*Attorney, Agent, or Firm*—Dressler, Goldsmith, Shore, Sutker & Milnamow, Ltd.

[57] ABSTRACT

A control device for digital display indicators using electromagnetic drums.

An analogue/digital converter converts the information to be displayed, received in analogue form E, into digital information which can be utilized by the drums of the display device. The renewal frequency of the information delivered by the analogue/digital converter is made a function of the rate of change of the information by means of a differentiator which calculates the derivative dE/dt and a means of comparing voltages and/or frequencies and means of controlling the analogue/digital converter and/or all or a proportion of the display drums.

6 Claims, 8 Drawing Figures

CONTROL OF DISPLAY DEVICES WITH ELECTROMAGNETIC DRUMS

BACKGROUND OF THE INVENTION

The present invention relates to digital display devices using drums which are actuated by a magnet capable of orientating itself in several stable directions by selective magnetization of the branches of a fixed, grouped magnetic circuit which receives digital information to be displayed.

Indicators of this type, which receive information in analogue form, therefore require an analogue/digital conversion system. The information to be displayed is usually renewed at a constant rate which is compatible with the response time required by the display means (for example, the frequency normally selected is around 2 Hz). However, the analogue/digital converter has a much shorter response time (of the order of 10 ms, for example, for a double track type system). An extra so-called "sequencing device" which produces conversion and store instructions for the calculated value at the selected renewal frequency is therefore added. The addition of these devices gives rise to a certain number of defects with regard to the display. In fact, even if the input information is perfectly stable, this display is not necessarily stable and would only be so as the result of the error introduced by the converter. Thus, the lowest digit can be seen to develop at the renewal rate, particularly if the input information is evolutionary and if this evolution takes place at a rate which is higher than the rate compatible with the renewal frequency. The numerical values displayed successively can be very far apart and, consequently, the directions of rotation of the different drums are neither constant nor in harmony with the input information. In other words, the display provided by drums does not give any indication of the "tendency" of the input in this case.

In order to overcome this disadvantage, a device forming the subject of the invention proposes to control the analogue/digital converter by means of a signal which is a function of the information to be displayed by making the frequency at which the display of the said information is renewed variable and/or a function of its rate of change. To do this, the circuit emitting the input information is connected to the input of both the analogue/digital converter and a differentiating circuit capable of performing the differentiation of the input quantity relative to time, the output of which is connected to a circuit containing means for comparing voltages and/or frequencies, means for producing frequencies and means for controlling the analogue/digital converter and/or all or a proportion of the display drums.

BRIEF DESCRIPTION OF THE DRAWINGS

The following description of the attached drawings is given by way of example in order to allow for a better understanding of the invention. In the drawings.

DETAILED DESCRIPTION OF THE DRAWINGS

Figure 1:
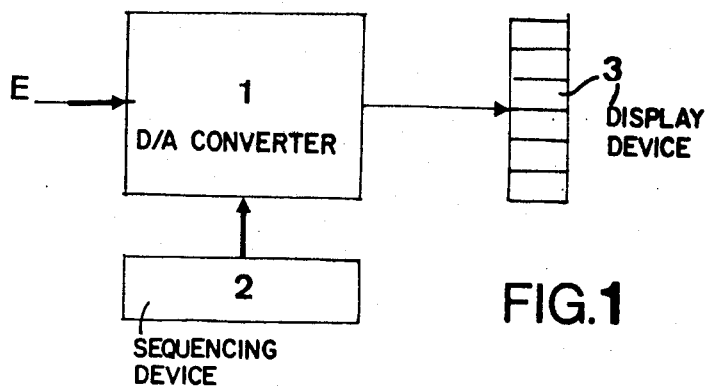
FIG. 1 is a diagram of a display device according to the prior art.

According to the prior art (FIG. 1), a test circuit (not shown) supplies a voltage E to the input of an analogue/digital converter 1 controlled by a sequencing device 2 which transmits conversion and store instructions to it at a fixed, predetermined frequency. The output of the converter 1 is connected to the input of the display device 3 by means of electromagnetic drums.

Figure 2A:
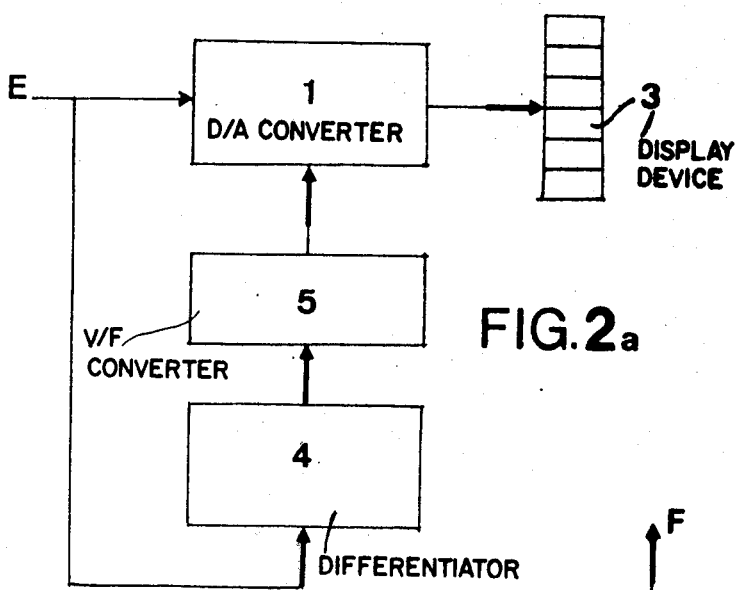
FIG. 2a is a general diagram of the invention.
Figure 2B:
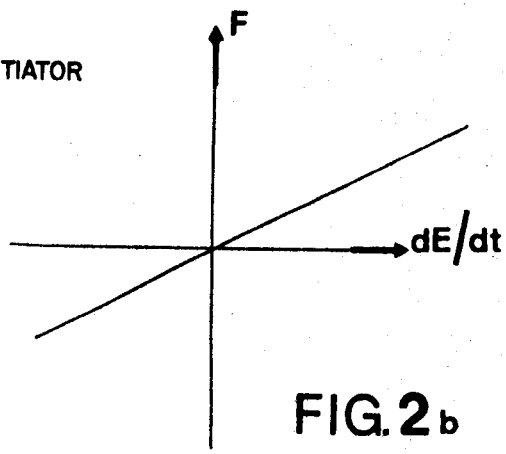
FIG. 2b is a plot of frequency F versus the time derivature of voltage E applicable to the embodiment of the invention shown in FIG. 2.

According to the invention, the analogue/digital converter is no longer controlled at a fixed frequency but at a frequency which varies as a function of the rate of change of the input signal thereto. The voltage E which is representive of the said signal is therefore fed both to the input of the converter 1 (FIG. 2a) as above and to the input of a differentiating circuit 4 capable of producing the time derivative of the input voltage. The voltage dE/dt thus obtained is fed to the input of a voltage/frequency converter 5 which produces a frequency proportional to the value of the derived voltage : $F = \alpha dE/dt$ (FIG. 2b). This frequency is then fed to the input controlling the rate of the analogue/digital converter 1 which thus converts the input voltage E into digital form at variable frequency. As an example, if a value of 1 is selected for the coefficient of proportionality $\alpha$, the rate frequency of the converter 1 will thus be 1 Hz for a rate of change of the signal equal to 1 bit of minimum weight per second.

In the limit cases where the rate of change of the signal (dE/dt) is either zero or very high, the device just described is not sufficient to ensure the proper functioning of the assembly. However, when dE/dt is almost zero, it is desirable, for reasons of safety, to maintain a frequency of displayed information renewal which is not zero. If, on the other hand, the rate of change of the signal (dE/dt) is high, the renewal frequency becomes incompatible with the rate of tracking of the drums, particularly with regard to the drum displaying the digit of lowest weight.

Figure 3:
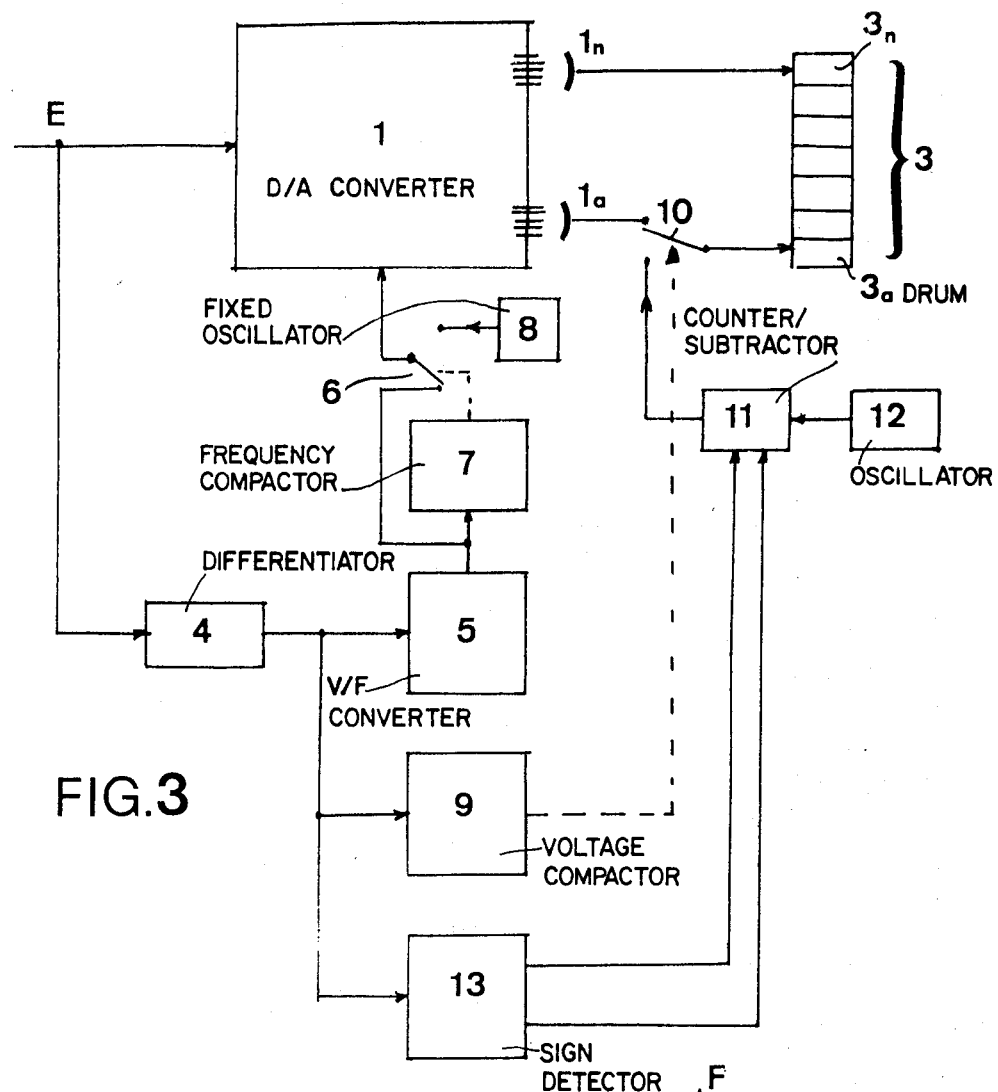
FIG. 3 is a block diagram of an embodiment according to the present invention.
Figure 3A:
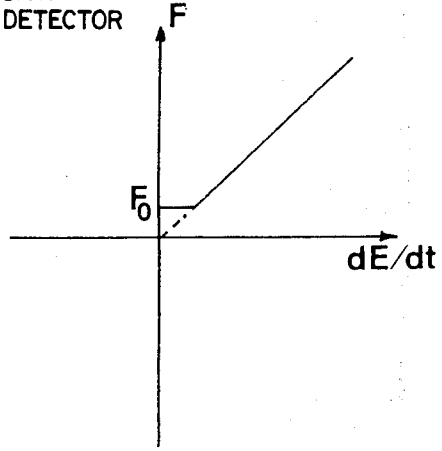
FIG. 3a is a plot of frequency F versus the time derivature of voltage E applicable to the embodiment shown in FIG. 3.
Figure 4:
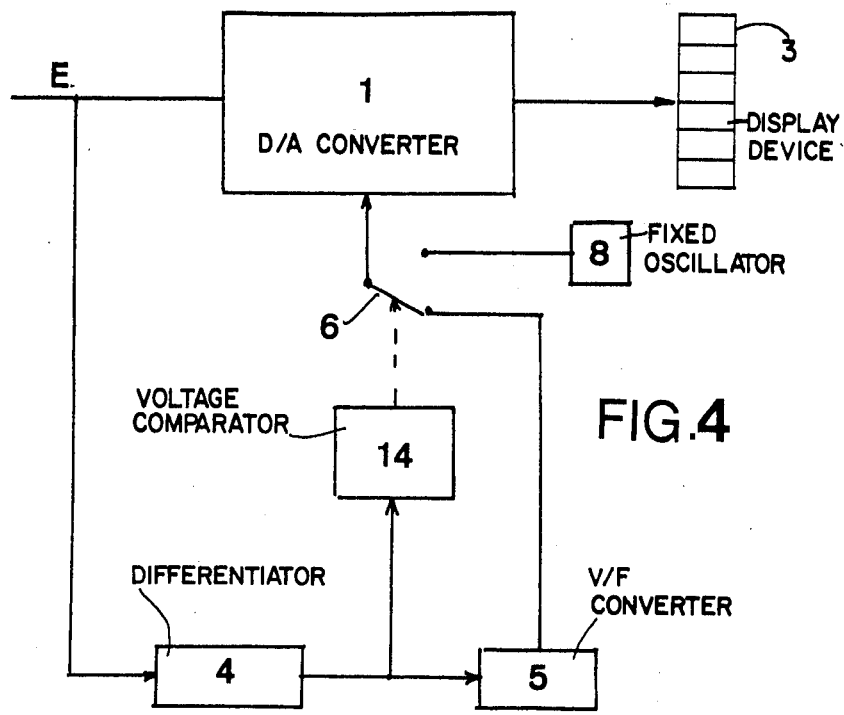
FIGS. 4 and 5 and 6 show various further embodiments of certain parts of the device according to the invention.

In both cases, the device described above therefore has to be adapted in order to overcome these disadvantages. To maintain a renewal rate Fo which is non-zero (FIG. 3a) when dE/dt is very close to zero, the output of the voltage/frequency converter 5 is connected both to one of the inputs of a switch 6 and to the input of a frequency comparator 7, the output of which controls the switch 6, the switch being capable of receiving at a second input pulses emitted by a means 8, such as, for example, an oscillator capable of supplying the predetermined frequency Fo. The output of the switch 6 is connected to the input for controlling the rate of the analogue/digital converter 1. The switch 6 is normally arranged so as to establish contact between the output of the voltage/frequency converter 5 and the input for controlling the rate of the analogue/digital converter 1, provided that the frequency F leaving the said converter 5 remains above Fo. When it falls below this value, the comparator 7 acts on the switch 6 which switches over to establish a contact between the oscillator 8 and the input for controlling the rate of the converter 1 which is thus driven at the frequency Fo. A variation of this device (FIG. 4) involves the use, not of a frequency comparator, but of a voltage comparator 14 which is connected to the output of the differentiator 4 and compares the value of dE/dt at each moment with a value (dE/dt)o corresponding to the selected frequency Fo and which acts on the switch 6 in the same way as described for the frequency comparator 7.

If the rate of change of the signal (dE/dt) exceeds the rate of tracking of the drums which is generally of the order of 2 to 3 revolutions per second, with operation becoming uncertain, a limit value $(dE/dt)_1$ is selected (of the order of 20 bits of minimum weight per second, for example), from which the drum displaying the digit of lowest weight is disconnected from the analogue/digital converter 1 so as to replace the reading supplied by this drum by a reading delivered at a fixed frequency. The device thus comprises a voltage comparator 9 (FIG. 3) for this purpose, which is connected to the output of the differentiator 4 and compares the instantaneous value of dE/dt with the predetermined value $(dE/dt)_1$. The output of the said comparator acts on a switch 10 whose output is connected to the input of the drum 3a displaying the figure of lowest weight and comprising two inputs, one connected to the output 1a of the analogue/digital converter 1 delivering the information about the digit of lowest weight, and the other to the output of a counter/subtractor 11 receiving from an oscillator 12 pulses of a frequency which is selected so as to ensure proper functioning of the drum 3a and which can be, for example, the frequency $F_1$ corresponding to the predetermined value $(dE/dt)_1$ at which switching occurs. The counter/subtractor 11 operates with the same code as the converter 1 (binary-code-decimal, for example) and is also connected to the output of a detector 13 whose input is connected to the output of the differentiator 4 and which detects the sign of the E/dt derivative in order to instruct the counter 11 to add or to subtract. When the display device is functioning normally, the switch 10 is arranged so as to connect drum 3a to the corresponding output of the converter 1. When the value $(dE/dt)_1$ is attained, the comparator 9 acts on the said switch 10, which switches over to establish a connection between the drum 3a and the counter/subtractor 11 which delivers to the said drum information at the frequency supplied by the oscillator 12, this information replacing that delivered by the converter 1 so as to limit the rate of tracking demanded of the drum.

Figure 6:
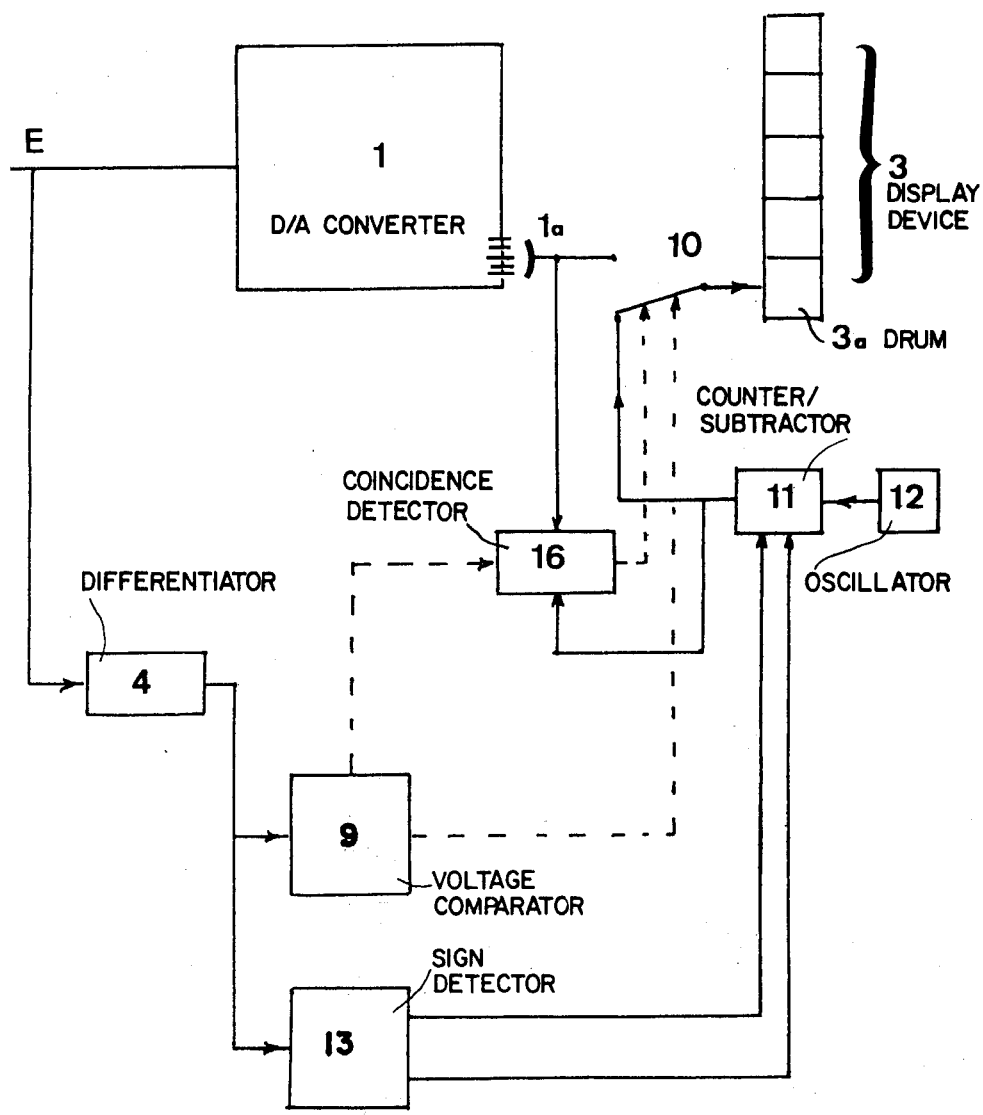

The same system can be used for the following drum when the rate attains a value which is a multiple of 10 of the first one, and so on. When the value of the derivative (dE/dt) falls below the value $(dE/dt)_1$ again, the comparator 9 emits a signal to control the direction of the switch 10 which switches over again so as to connect the drum 3a to the cooperating input 1a of the analogue/digital converter 1. At this moment, if the reading supplied by the converter does not coincide with the reading transmitted previously by the counter/subtractor 11, there will be discontinuity in the display of the drum 3a. To avoid this drawback, a control pulse issuing from the comparator 9 can be transmitted (FIG. 6) not to the switch 10 but to a coincidence detector 16 connected between the output 1a of the converter 1 and the output of the counter/substractor 11. When the said detector observes that the information delivered by the converter 1 and the counter 11 coincide, it delivers a control pulse to the switch 10 which switches over.

Figure 5:
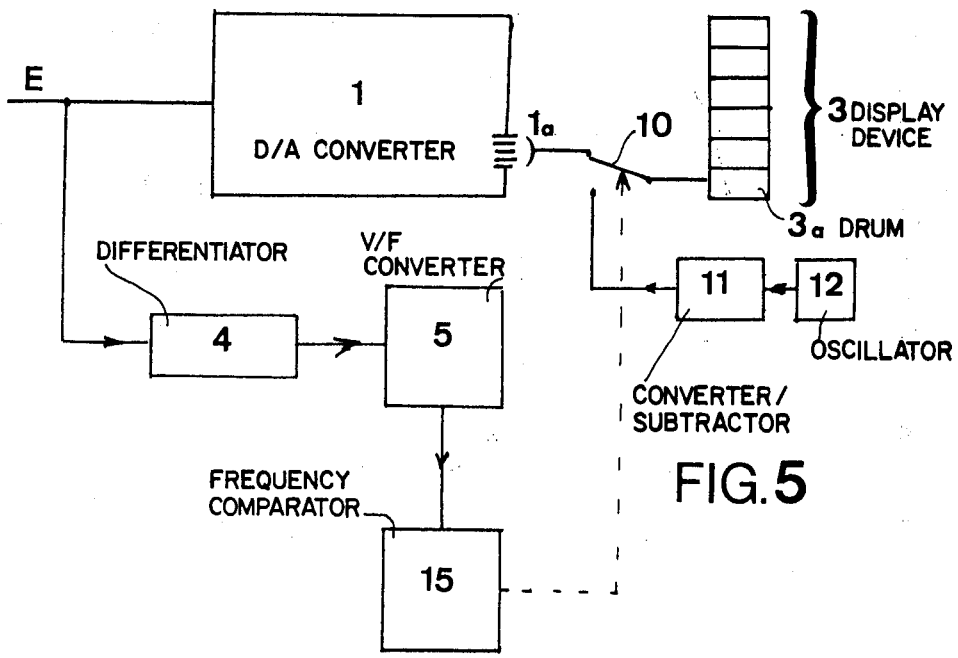

In the case just described, the comparator 9 compares its value directly with the value of the (dE/dt) derivative leaving the differentiator 4. In a variation (FIG. 5), this comparison with the frequency is made by connecting a frequency comparator 15 to the output of the voltage/frequency converter 5. The principle of the device is otherwise unchanged, the comparator acting on the switch 10 at a frequency $F_1$ corresponding to the value $(dE/dt)_1$ used previously.

Of course, all or a proportion of the devices described above can be used, depending on the nature of the quantity to be displayed. If the quantity remains within the rates of change which are compatible with the restraints of the display, the variable frequency control device of the analogue/digital converter can be used alone. Similarly, one or more of the devices described for use with readings having rates of change which are too low or too high, may be employed.

Similarly, when the information is transmitted directly to the display device in digital form, the device providing for limiting the rate of tracking of the drums when the rate of renewing the information becomes too high can still be used.

What is claimed is:

1. A control device for digital display indicators having electromagnetic drums of the type containing an analogue/digital convertor capable of receiving in analogue form an information to be displayed, the convertor having an output connected to the digital display indicator drums and a second input for controlling the rate of conversion operations at a selected frequency, the improvement comprising:

a differentiating circuit capable of producing as its output the time derivative of the quantity inputted to it; and circuit means, whose input is connected to the output of said differentiating circuit, for producing as its output a selected frequency depending on quantity inputted to it, whereby when the quantity inputted to said differentiating circuit is the same as the information inputted to said analogue/digital convertor and the output of said circuit means is connected to the second input of said analogue/digital convertor, the rate of conversion of the analogue/digital convertor is controlled by the time rate of change of the information to be displayed.

2. A device according to claim 1, wherein the circuit means includes a voltage/frequency convertor connected between the output of the differentiating circuit and the second input of said analogue/digital convertor which controls the rate of conversion of the analogue/digital convertor.

3. A device according to claim 2, wherein the circuit to which the output of the differentiating circuit is connected further comprises means for comparing voltages and/or frequency.

4. A device according to claim 3, further comprising a converter control switch having an output connected to the input for controlling the rate of the analogue/digital converter, and switchable between two inputs, one of which inputs is connected to an output of the volage/frequency converter and the other of which to a means for producing a fixed frequency, the switch being controlled by the means for comparing voltages or frequencies, which means is connected respectively to the output of the differentiating circuit or of the voltage/frequency converter.

5. A device according to claim 3, further comprising a detector connected to the output of the differentiating circuit and capable of detecting the sign of a signal at the output of said differentiating circuit; a counter/subtractor connected to the detector, the detector supplying instructions to add or subtract to the counter/subtractor when in use; means connected to the counter/subtractor for supplying a fixed frequency thereto; and a drum control switch having a output connected to one of the display drums, and the switch being switchable between two inputs, one of which inputs being connected to a respective output of the analogue/digital converter for the instant display drum and the other to the output of counter/subtractor, said switch being controlled either by the means for comparing voltage which is connected to the output of the differentiator or by the means for comparing frequency which is connected to the output of the voltage/frequency converter.

6. A device according to claim 5, further comprising a coincidence detector, connected between the respective one of the analogue/digital converter outputs and an output of the counter/subtractor, on which acts the means of comparing the voltage or frequency and which itself acts to control the drum control switch whose output is connected to the input of the display drum cooperating with the instant analogue/digital converter output.

* * * * *